US012712009B2

(12) United States Patent
Mitsubori et al.

(10) Patent No.: US 12,712,009 B2
(45) Date of Patent: Aug. 18, 2026

(54) SEMICONDUCTOR DEVICE HAVING DQS COUNTER CIRCUIT

(71) Applicant: MICRON TECHNOLOGY, INC., Boise, ID (US)

(72) Inventors: Shingo Mitsubori, Tokyo (JP); Yutaka Uemura, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 113 days.

(21) Appl. No.: 18/781,037

(22) Filed: Jul. 23, 2024

(65) Prior Publication Data

US 2025/0191638 A1 Jun. 12, 2025

Related U.S. Application Data

(60) Provisional application No. 63/607,478, filed on Dec. 7, 2023.

(51) Int. Cl.

| | |
|---|---|
| ***G11C 11/40*** | (2006.01) |
| ***G11C 11/4076*** | (2006.01) |
| ***G11C 11/4093*** | (2006.01) |
| ***G11C 11/4096*** | (2006.01) |

(52) U.S. Cl.
CPC ...... *G11C 11/4076* (2013.01); *G11C 11/4093* (2013.01); *G11C 11/4096* (2013.01)

(58) Field of Classification Search
CPC ............ G11C 11/4076; G11C 11/4093; G11C 11/4096; G11C 7/1087; G11C 7/1093
See application file for complete search history.

(56) References Cited

U.S. PATENT DOCUMENTS

| | | | | |
|---|---|---|---|---|
| 6,125,078 A * | 9/2000 | Ooishi | G11C 7/1072 | 365/230.03 |
| 2015/0155019 A1* | 6/2015 | Kim | G11C 7/1093 | 365/189.05 |
| 2023/0223073 A1* | 7/2023 | Kim | G11C 11/4096 | 365/230.01 |

* cited by examiner

*Primary Examiner* — Mohammed A Bashar
(74) *Attorney, Agent, or Firm* — Dorsey & Whitney LLP

(57) ABSTRACT

An example apparatus includes a dividing circuit configured to divide an original data strobe signal supplied synchronously with a set of write data to generate first to fourth data strobe signals having mutually different phase from one another, a first data latch circuit configured to latch one of the set of write data synchronously with the first data strobe signal, the first data latch circuit being configured to be reset responsive to a first reset signal; a second data latch circuit configured to latch another of the set of write data synchronously with the second data strobe signal, the second data latch circuit being configured to be reset responsive to a second reset signal; and a burst counter circuit configured to activate the first and second reset signals responsive to the third and fourth data strobe signals.

20 Claims, 11 Drawing Sheets

PASEL
BLSEL
22
SELD
30
38
39
74
Wr45(0)
36
WEM2
DQS0
D Q
R
32
33
34
35
37
71
Wr67(0)
Q D
S
31
LBM1
40
48
49
46
Wr45
(90)
70
Wr67(90)
DQS90
LBM0
42
43
44
45
47
41
73
50
Wr45(180)
DQS180
Wr67(180)
LBM3
60
DQS270
Wr67(270)
LBM2
72

SEL
CRCEN
SELD

FIG.4B

SEMICONDUCTOR DEVICE HAVING DQS COUNTER CIRCUIT

CROSS REFERENCE TO RELATED APPLICATION(S)

This application claims priority to U.S. Provisional Application No. 63/607,478, filed Dec. 7, 2023. The aforementioned application is incorporated herein by reference, in its entirety, for any purpose.

BACKGROUND

In a write operation in a semiconductor memory device such as a DRAM, write data is input in a serial manner synchronously with a data strobe signal. After completion of the input of a series of write data, a gating circuit blocks the data strobe signal so as to prevent propagation of the unnecessary data strobe signal to an internal circuit. In addition, a data latch circuit for latching the write data is reset in conjunction with completion of the input of the write data.

BRIEF DESCRIPTION OF THE DRAWINGS

FIG. 4B is a circuit diagram showing circuits that generate selection signals;

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
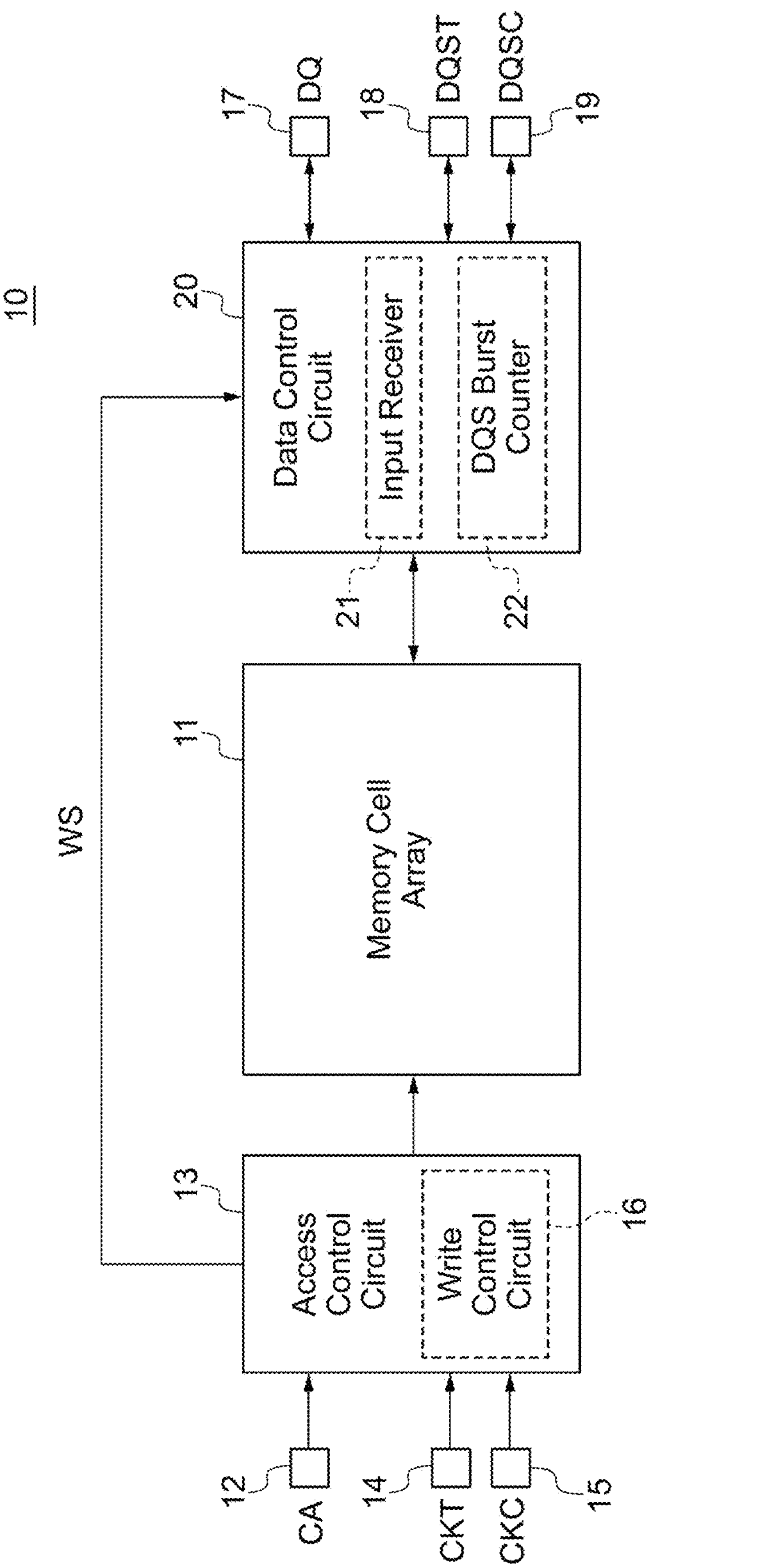
FIG. 1 is a block diagram showing a configuration of a semiconductor memory device according to an embodiment of the present disclosure.

FIG. 1 is a block diagram showing a configuration of a semiconductor memory device 10 according to an embodiment of the present disclosure. The semiconductor memory device 10 shown in FIG. 1 is a DDR5 DRAM and includes a memory cell array 11. When access is made to the memory cell array 11, a command address signal CA is input to a command address terminal 12 from outside. The command address signal CA is supplied to an access control circuit 13. The access control circuit 13 decodes the command address signal CA and counts the latency, for example, synchronously with complementary clock signals CKT and CKC respectively input to clock terminals 14 and 15. In a case where a command included in the command address signal CA indicates a rad operation, read access is made to a memory cell included in the memory cell array 11 based on an address included in the command address signal CA. Read data DQ mad out from the memory cell thus accessed is output to the outside from a data 1/O terminal 17 via a data control circuit 20.

In a case where the command included in the command address signal CA indicates a write operation, the access control circuit 13 activates a write start signal WS at a predetermined timing. The write start signal WS is generated by a write control circuit 16 included in the access control circuit 13. The write start signal WS is activated at a timing immediately before a burst input of a set of write data DQ from the outside to the data I/O terminal 17. The write data DQ input to the data I/O terminal 17 is transferred to the memory cell array 11 via an input receiver circuit 21 included in the data control circuit 20. The write data DQ is input synchronously with complementary data strobe signals DQST and DQSC respectively supplied to data strobe terminals 18 and 19. The write data DQ thus transferred to the memory cell array 11 is written to a memory cell included in the memory cell array 11 based on the address included in the command address signal CA.

The data control circuit 20 includes a burst counter 22. The burst counter 22 detects an end timing of inputting a series of write data DQ input in a serial manner in the write operation.

Figure 2:
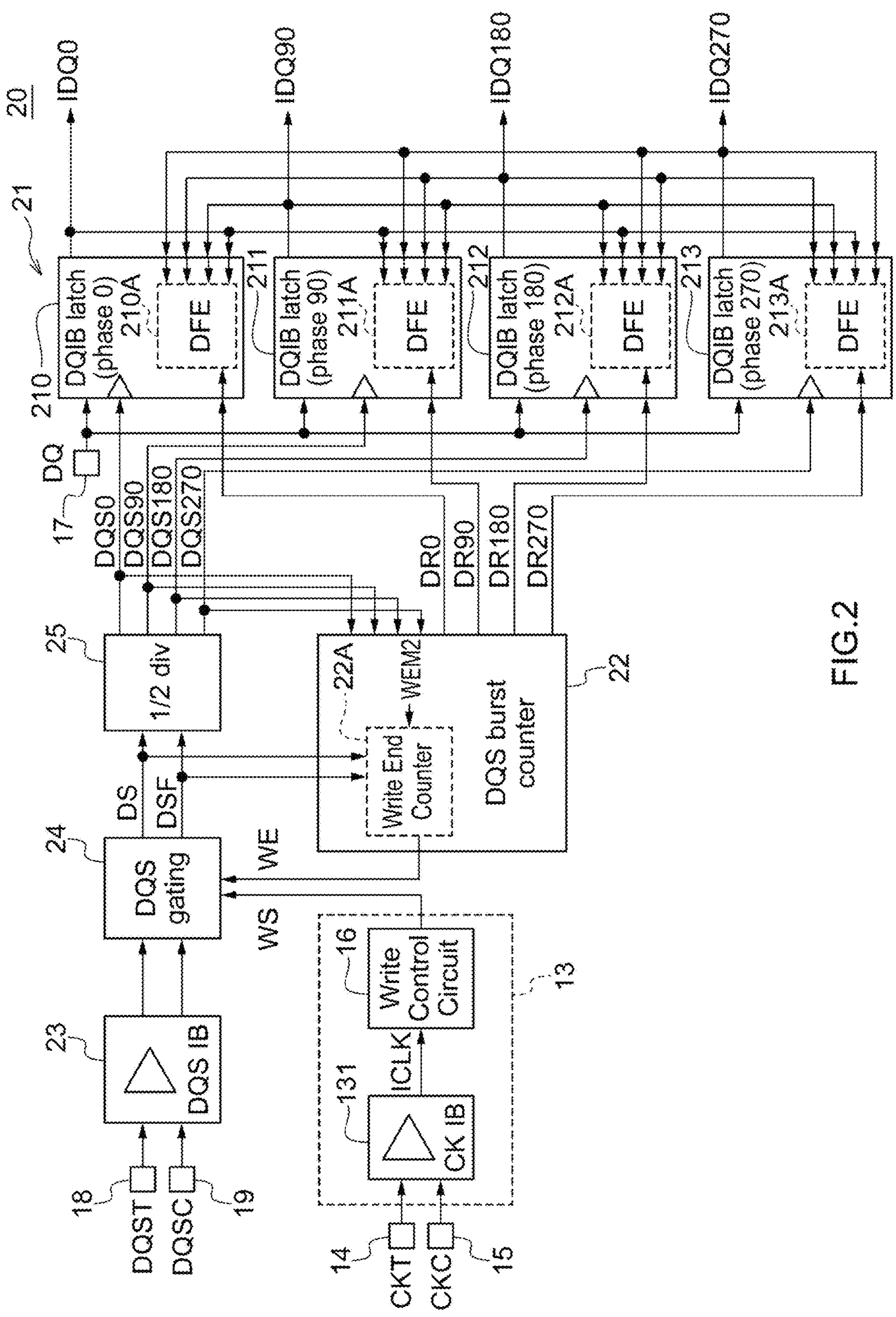
FIG. 2 is a block diagram showing a configuration of main parts of a data control circuit.

FIG. 2 is a block diagram showing a configuration of main parts of the data control circuit 20. The data control circuit 20 includes a gating circuit 24 that receives the data strobe signals DQST and DQSC via an input buffer 23, as shown in FIG. 2. The gating circuit 24 allows the data strobe signals DQST and DQSC to pass therethrough responsive to the write start signal WS and blocks the data strobe signals DQST and DQSC responsive to a write end signal WE. Accordingly, the unnecessary data strobe signals DQST and DQSC are prevented from being propagated to an internal circuit. The write control circuit 16 that generates the write start signal WS operates synchronously with an internal clock signal ICLK generated by an input buffer 131. Data strobe signals DS and DSF output from the gating circuit 24 respectively correspond to the data strobe signals DQST and DQSC. The data strobe signals DS and DSF are input to a dividing circuit 25. The dividing circuit 25 divides the data strobe signals DS and DSF to generate data strobe signals DQS0, DQS90, DQS180, and DQS270 for four phases. Assuming that the phase of the data strobe signal DQS0 is 0°, the phases of the data strobe signals DQS90, DQS180, and DQS270 are 90°, 180°, and 270°, respectively. The data strobe signals DQS0, DQS90, DQS180, and DQS270 are supplied to the input receiver circuit 21 and the burst counter 22.

The input receiver circuit 21 includes a data latch circuit 210 that latches write data DQ synchronously with the data strobe signal DQS0, a data latch circuit 211 that latches the write data DQ synchronously with the data strobe signal DQS90, a data latch circuit 212 that latches the write data DQ synchronously with the data strobe signal DQS180, and a data latch circuit 213 that latches the write data DQ synchronously with the data strobe signal DQS270. A set of write data IDQ0, IDQ90, IDQ180, and IDQ270 respectively latched by the data latch circuits 210 to 213 is transferred to the memory cell array 11.

The data latch circuits 210 to 213 respectively include DFE (Decision Feedback Equalizer) circuits 210A to 213A for reducing ISI (Intersymbol Interference) noise. The data latched by the data latch circuit 210 is fed back to the DFE circuit 211A included in the data latch circuit 211, the DFE circuit 212A included in the data latch circuit 212, the DFE circuit 213A included in the data latch circuit 213, and its own DFE circuit 210A. The data latched by the data latch circuit 211 is fed back to the DFE circuit 212A included in the data latch circuit 212, the DFE circuit 213A included in the data latch circuit 213, the DFE circuit 210A included in the data latch circuit 210, and its own DFE circuit 211A. The data latched by the data latch circuit 212 is fed back to the DFE circuit 213A included in the data latch circuit 213, the DFE circuit 210A included in the data latch circuit 210, the DFE circuit 211A included in the data latch circuit 211, and its own DFE circuit 212A. The data latched by the data latch circuit 213 is fed back to the DFE circuit 210A included in the data latch circuit 210, the DFE circuit 211A included in the data latch circuit 211, the DFE circuit 212A included in the data latch circuit 212, and its own DFE circuit 213A. The statuses of the DFE circuits 210A to 213A are reset by data reset signals DR0, DR90, DR180, and DR270, respectively. The data reset signals DR0, DR90, DR180, and DR270 are generated by the burst counter 22. The burst counter 22 generates the data reset signals DR0, DR90, DR180, and DR270 and the write end signal WE based on the data strobe signals DQS0, DQS90, DQS180, and DQS270. The write end signal WE is generated by a write end control circuit 22A included in the burst counter 22. The write end control circuit 22A activates the write end signal WE synchronously with the data strobe signals DS and DSF after a write end signal WEM2 generated synchronously with the data strobe signals DQS0, DQS90, DQS180, and DQS270 is activated.

Figure 3A:
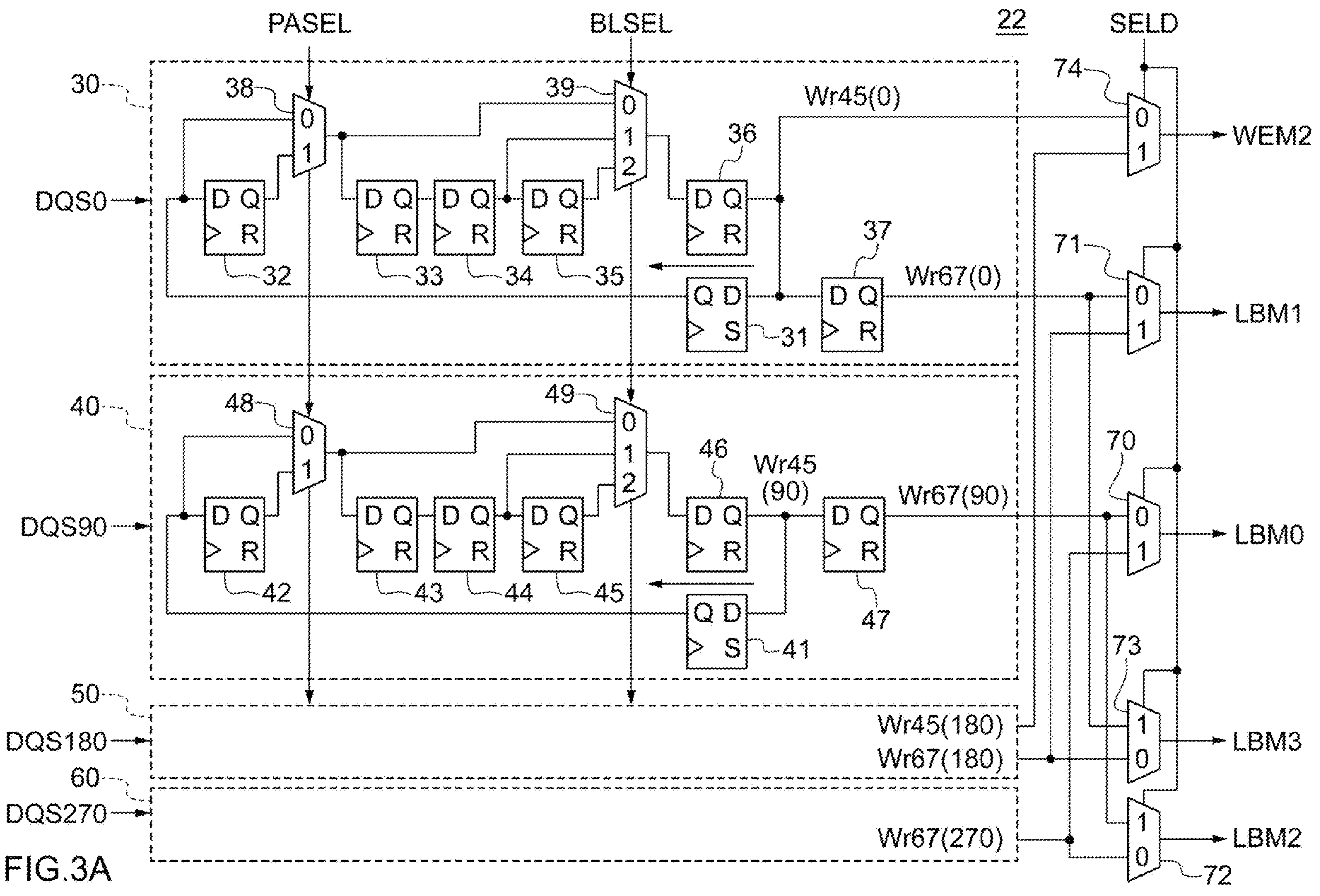
FIG. 3A is a circuit diagram of a burst counter according to a first embodiment.

FIG. 3A is a circuit diagram of the burst counter 22 according to a first embodiment. The burst counter 22 according to the first embodiment includes a shift register 30 that performs a shift operation synchronously with the data strobe signal DQS0, a shift register 40 that performs a shift operation synchronously with the data strobe signal DQS90, a shift register 50 that performs a shift operation synchronously with the data strobe signal DQS180, and a shift register 60 that performs a shift operation synchronously with the data strobe signal DQS270. Latch circuits 31 to 37 included in the shift register 30 each latch data supplied to a data input node D thereof synchronously with the data strobe signal DQS0 and output the latched data from a data output node Q thereof. In addition, the latch circuit 31 has a set node S, and the latch circuits 32 to 37 each have a reset node R. An initialization signal is supplied to the set node S and the reset nodes R in common. Accordingly, when the initialization signal is activated, the output of the latch circuit 31 becomes level "1" and the outputs of the latch circuits 32 to 37 become level "0". The latch circuits 31 to 36 are connected in a circulating manner. The latch circuit 37 is connected in the subsequent stage of the latch circuit 36. A multiplexer 38 selects whether to bypass the latch circuit 32 based on a selection signal PASEL. The selection signal PASEL indicates whether a data strobe signal includes a preamble. In a case where the data strobe signal does not include a preamble, the latch circuit 32 is bypassed by the multiplexer 38. A multiplexer 39 selects whether to bypass the latch circuits 33 to 35 based on a selection signal BLSEL. The selection signal BLSEL indicates a burst length and also indicates whether a CRC (Cyclic Redundancy Check) bit is added to write data DQ. In a case where the burst length is 8 bits (BL=8) and the CRC is not enabled, the latch circuits 33 to 35 are bypassed by the multiplexer 39. In a case where the burst length is 16 bits (BL=16), if no CRC bit is added to the write data DQ, the latch circuit 35 is bypassed by the multiplexer 39. A signal Wr45(0) output from the latch circuit 36 is supplied to an input node "0" of a multiplexer 74. A signal Wr67(0) output from the latch circuit 37 is supplied to an input node "0" of a multiplexer 71 and an input node "1" of a multiplexer 73.

The other shift registers 40, 50, and 60 also have the same circuit configuration as the shift register 30 except that the data strobe signals DQS90, DQS180, and DQS270 are used as a timing signal for a shift operation, respectively. For example, the shift register 40 includes latch circuits 41 to 46 connected in a circulating manner, a latch circuit 47 connected in the subsequent stage of the latch circuit 46, and multiplexers 48 and 49. A signal Wr67(90) output from the latch circuit 47 is supplied to an input node "0" of a multiplexer 70 and an input node "1" of a multiplexer 72. A signal Wr45(180) output from the shift register 50 is supplied to an input node "1" of the multiplexer 74, and a signal Wr67(180) output from the shift register 50 is supplied to an input node "1" of the multiplexer 71 and an input node "0" of the multiplexer 73. A signal Wr67(270) output from the shift register 60 is supplied to an input node "1" of the multiplexer 70 and an input node "0" of the multiplexer 72. The outputs of the multiplexers 70 to 73 serve as last bit signals LBM0 to LBM3, respectively. The output of the multiplexer 74 serves as the write end signal WEM2. The multiplexers 70 to 74 are all controlled by a selection signal SELD.

Figure 3B:
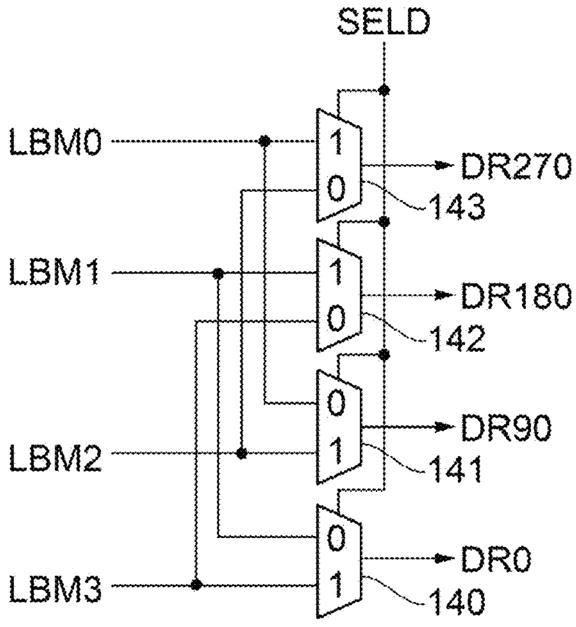
FIG. 3B is a circuit diagram showing circuits that generate reset signals included in the burst counter.

FIG. 3B is a circuit diagram showing circuits that generate the data reset signals DR0, DR90, DR180, and DR270 included in the burst counter 22. The burst counter 22 includes multiplexers 140 to 143 that generate the data reset signals DR0, DR90, DR180, and DR270 based on the last bit signals LBM0 to LBM3. The last bit signal LBM0 is supplied to an input node "0" of the multiplexer 141 and an input node "1" of the multiplexer 143. The last bit signal LBM1 is supplied to an input node "0" of the multiplexer 140 and an input node "1" of the multiplexer 142. The last bit signal LBM2 is supplied to an input node "1" of the multiplexer 141 and an input node "0" of the multiplexer 143. The last bit signal LBM3 is supplied to an input node "1" of the multiplexer 140 and an input node "0" of the multiplexer 142. The multiplexers 140 to 143 are all controlled by the selection signal SELD.

Figure 4A:
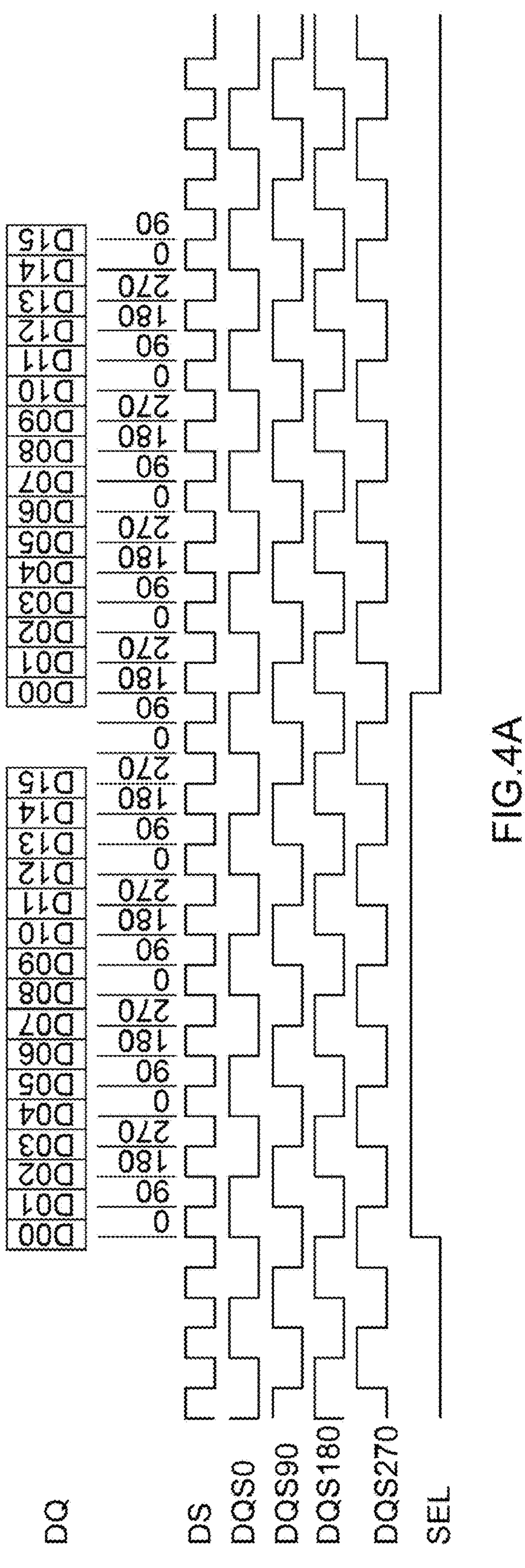
FIG. 4A is a timing chart for explaining a start timing of a burst input.
Figure 4B:
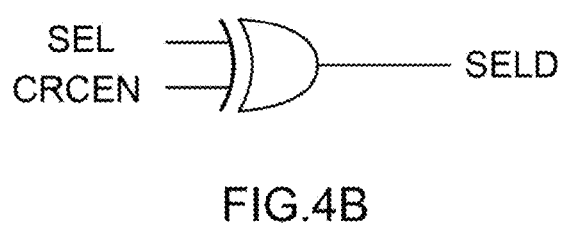

In the example shown in FIG. 4A, a 16-bit burst input occurs twice consecutively. The burst input starts synchronously with arising edge of the data strobe signal DQS0 in the first burst input, whereas the burst input starts synchronously with a rising edge of the data strobe signal DQS180 in the second burst input. As described above, there are two cases of burst input of write data DQ including a case where the burst input starts synchronously with a rising edge of the data strobe signal DQS0 and a case where the burst input starts synchronously with a rising edge of the data strobe signal DQS180. In the case where the burst input starts synchronously with a rising edge of the data strobe signal DQS0, the selection signal SEL becomes level "1". In the case where the burst input starts synchronously with arising edge of the data strobe signal DQS180, the selection signal SEL becomes level "0". Further, in a case where a CRC bit is added to the write data DQ, an enable signal CRCEN becomes level "1". The selection signal SEL and the enable signal CRCEN are input to an EXOR circuit shown in FIG. 4B, whereby the selection signal SELD is generated.

Figure 5:
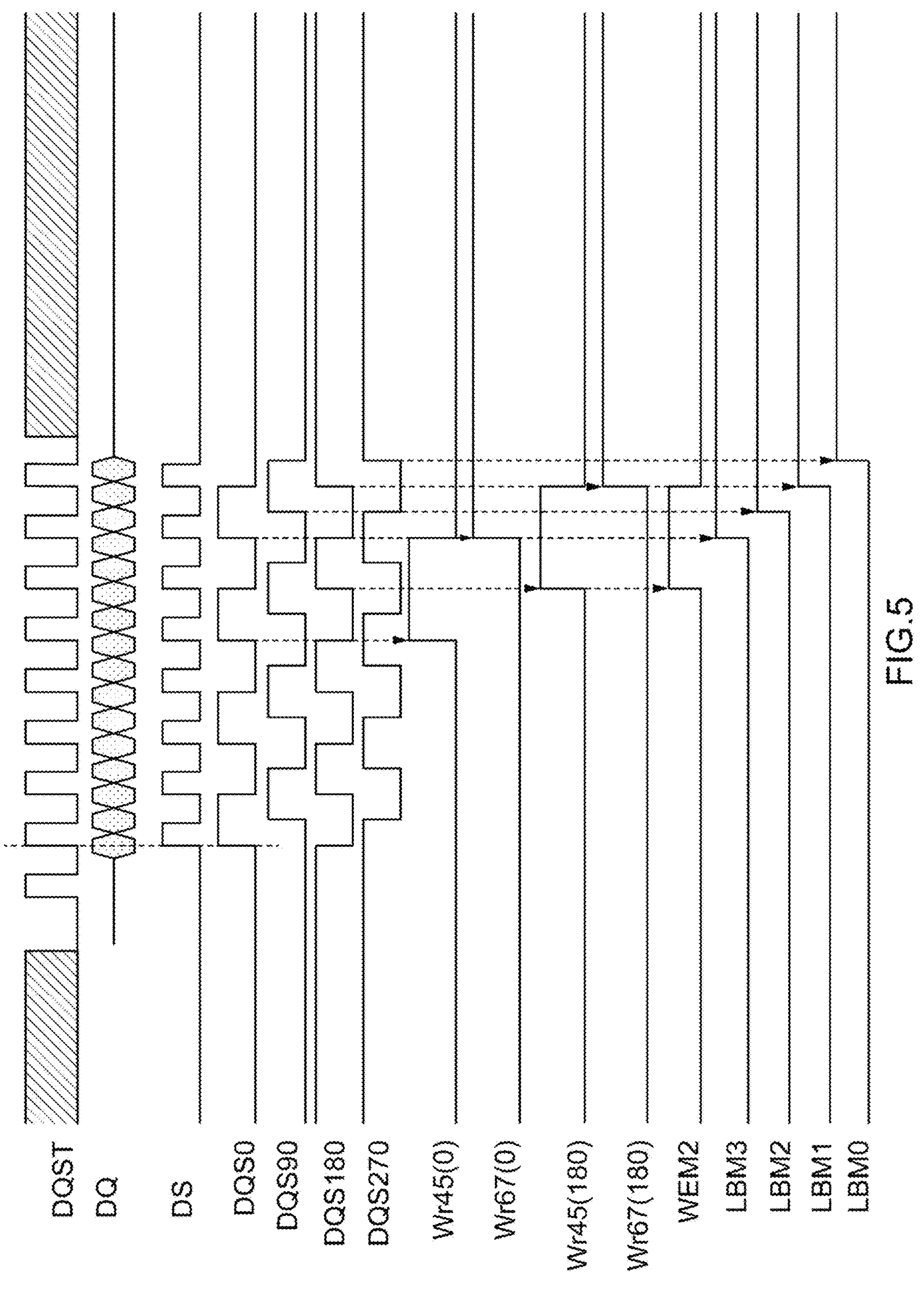
FIG. 5 is a timing chart for explaining an operation of the burst counter.

FIG. 5 is a timing chart for explaining an operation of the burst counter 22. In the example shown in FIG. 5, a 16-bit burst input starts synchronously with arising edge of the data strobe signal DQS0. No CRC bit is added to the write data DQ. Therefore, the selection signal SELD is level "1", and the multiplexers 70 to 74 shown in FIG. 3A and the multiplexers 140 to 143 shown in FIG. 3B all select the input node "1". Further, no preamble is included in the data strobe signals in the example shown in FIG. 5. Therefore, the multiplexer 38 selects the input node "0" based on the selection signal PASEL. The burst length is 16 bits, and therefore the multiplexer 39 selects the input node "1" based on the selection signal BLSEL.

In this case, the signal Wr45(0) changes to level "1" responsive to the third rising edge of the data strobe signal DQS0, and the signal Wr67(0) changes to level "1" responsive to the fourth rising edge of the data strobe signal DQS0, as shown in FIG. 5. Further, the signal Wr45(180) changes to level "1" responsive to the third rising edge of the data strobe signal DQS180, and the signal Wr67(180) changes to level "1" responsive to the fourth rising edge of the data strobe signal DQS180. As a result, the write end signal WEM2 is activated at a timing at which the signal Wr45 (180) changes to level "1". The write end signal WEM2 is supplied to the write end control circuit 22A shown in FIG. 2. The write end control circuit 22A counts 2.5 clock cycles synchronously with the data strobe signals DS and DSF after activation of the write end signal WEM2, and then activates the write end signal WE. When the write end signal WE is activated, the data strobe signals DQST and DQSC are blocked by the gating circuit 24.

Next, the last bit signal LBM3 is activated responsive to the signal Wr7(0), thus causing the data reset signal DR0 to be activated. Consequently, the status of the DFE circuit 210A included in the data latch circuit 210 is reset. Next, the last bit signal LBM2 is activated responsive to the signal Wr67(90), thus causing the data reset signal DR90 to be activated. Consequently, the status of the DFE circuit 211A included in the data latch circuit 211 is reset. The signal Wr67(90) changes to level "1" responsive to the fourth rising edge of the data strobe signal DQS90. Next, the last bit signal LBM1 is activated responsive to the signal Wr67 (180), thus causing the data reset signal DR180 to be activated. Consequently, the status of the DFE circuit 212A included in the data latch circuit 212 is reset. Next, the last bit signal LBM0 is activated responsive to the signal Wr67 (270), thus causing the data reset signal DR270 to be activated. Consequently, the status of the DFE circuit 213A included in the data latch circuit 213 is reset. The signal Wr67(270) changes to level "1" responsive to the fourth rising edge of the data strobe signal DQS270.

Consequently, the statuses of the DFE circuits 210A, 211A, 212A, and 213A are set in this order. Further, the data strobe signals DQST and DQSC are blocked by the gating circuit 24 at the same time as when the 16-bit burst input ends, so that toggles of the data strobe signals DQS0, DQS90, DQS180, and DQS270 are stopped.

Use of the burst counter 22 according to the first embodiment shown in FIG. 3A ensures a margin of 1 clock cycle in a shift operation (corresponding to 2 clock cycles of the data strobe signal DQST), because the shift registers 30, 40, 50, and 60 perform a shift operation synchronously with the data strobe signals DQS0, DQS90, DQS180, and DQS270, respectively. Accordingly, even if the frequencies of the data strobe signals are high, an operation margin can be ensured sufficiently.

Figure 6:
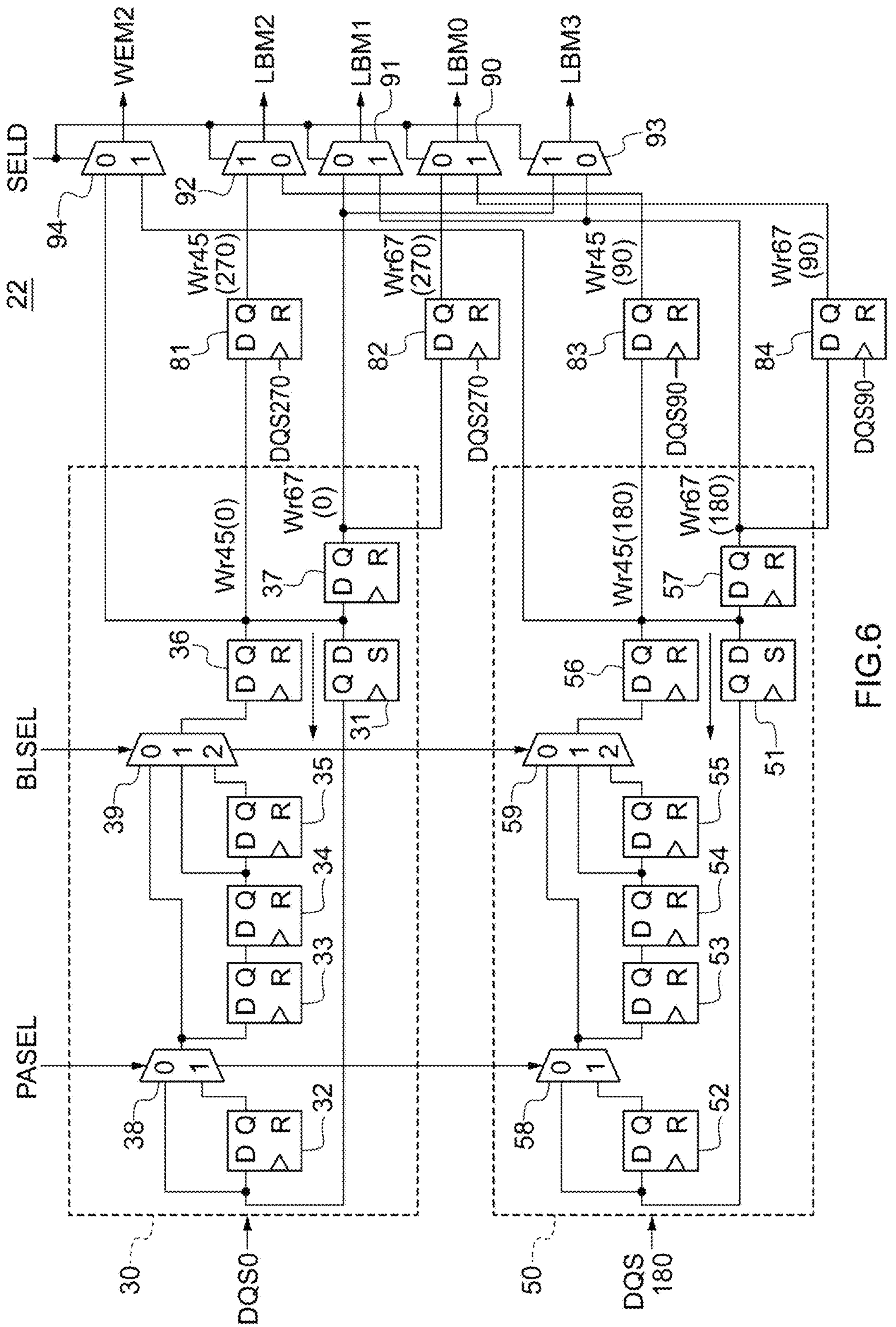
FIG. 6 is a circuit diagram of a burst counter according to a second embodiment.

FIG. 6 is a circuit diagram of the burst counter 22 according to a second embodiment. The burst counter 22 according to the second embodiment shown in FIG. 6 is different from the burst counter 22 according to the first embodiment shown in FIG. 3A in that the shift registers 40 and 60 are omitted and latch circuits 81 and 82 performing a latch operation synchronously with the data strobe signal DQS270 and latch circuits 83 and 84 performing a latch operation synchronously with the data strobe signal DQS90 are added. The signal Wr45(0) output from the latch circuit 36 is supplied to a data input node D of the latch circuit 81. The signal Wr67(0) output from the latch circuit 37 is supplied to a data input node D of the latch circuit 82. The signal Wr45(180) output from the latch circuit 56 is supplied to a data input node D of the latch circuit 83. The signal Wr67(180) output from the latch circuit 57 is supplied to a data input node D of the latch circuit 84.

The burst counter 22 shown in FIG. 6 includes multiplexers 90 to 94. The signal Wr45(0) output from the latch circuit 36 is supplied to an input node "0" of the multiplexer 94. The signal Wr67(0) output from the latch circuit 37 is supplied to an input node "0" of the multiplexer 91 and an input node "1" of the multiplexer 93. The signal Wr45(180) output from the latch circuit 56 is supplied to an input node "1" of the multiplexer 94. The signal Wr67(180) output from the latch circuit 57 is supplied to an input node "1" of the multiplexer 91 and an input node "0" of the multiplexer 93. The signal Wr45(270) output from the latch circuit 81 is supplied to an input node "1" of the multiplexer 92. The signal Wr67(270) output from the latch circuit 82 is supplied to an input node "0" of the multiplexer 90. The signal Wr45(90) output from the latch circuit 83 is supplied to an input node "0" of the multiplexer 92. The signal Wr67(90) output from the latch circuit 84 is supplied to an input node "1" of the multiplexer 90. The outputs of the multiplexers 90 to 93 serve as the last bit signals LBM0 to LBM3, respectively. The output of the multiplexer 94 serves as the write end signal WEM2. The multiplexers 90 to 94 are all controlled by the selection signal SELD.

Figure 7:
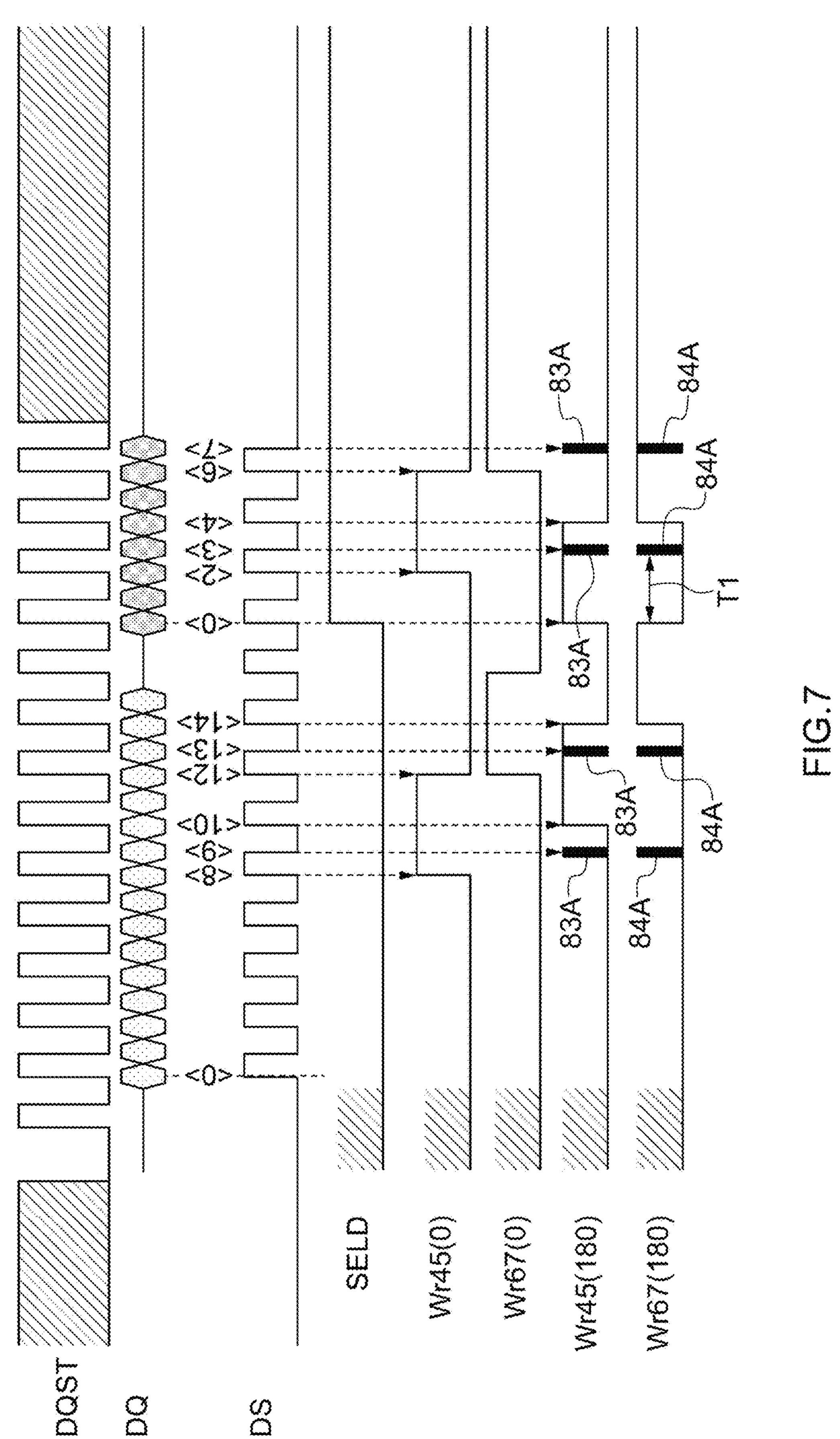
FIG. 7 is a timing chart for explaining an operation of the burst counter shown in FIG. 6.

FIG. 7 is a timing chart for explaining an operation of the burst counter 22 shown in FIG. 6. In the example shown in FIG. 7, an 8-bit burst input is performed immediately after a 16-bit burst input is performed. The toggle count of the data strobe signal DQST input between the first burst input and the second burst input is one. In this manner, in a case where the toggle count of the data strobe signal DQST input between burst inputs is odd-numbered (it is assumed that in a case where CRC is enabled, a CRC bit is not a portion of the write data DQ), the selection signal SELD is inverted. The first burst input corresponds to a case where a burst input starts synchronously with a rising edge of the data strobe signal DQS0, and the second burst input corresponds to a case where a burst input starts synchronously with a rising edge of the data strobe signal DQS180. In FIG. 7, the first rising edge of the data strobe signal DS supplied synchronously with a burst input is represented by <0>.

In the first burst input, the signal Wr45(0) changes to level "1" at an edge <8> of the data strobe signal DS. The edge <8> corresponds to the third rising edge of the data strobe signal DQS0. Next, the signal Wr45(180) changes to level "1" at an edge <10> of the data strobe signal DS. The edge <10> corresponds to the third rising edge of the data strobe signal DQS180. Next, the signal Wr67(0) changes to level "1" at an edge <12> of the data strobe signal DS. The edge <12> corresponds to the fourth rising edge of the data strobe signal DQS0. Next, the signal Wr67(180) changes to level "1" at an edge <14> of the data strobe signal DS. The edge <14> corresponds to the fourth rising edge of the data strobe signal DQS180.

In the second burst input, the signal Wr45(180) changes to level "1" at the edge <0> of the data strobe signal DS. The edge <0> corresponds to the first rising edge of the data strobe signal DQS180. Next, the signal Wr45(0) changes to level "1" at an edge <2> of the data strobe signal DS. The edge <2> corresponds to the first rising edge of the data strobe signal DQS0. Next, the signal Wr67(180) changes to level "1" at an edge <4> of the data strobe signal DS. The edge <4> corresponds to the second rising edge of the data strobe signal DQS180. Next, the signal Wr67(0) changes to level "1" at an edge <6> of the data strobe signal DS. The edge <6> corresponds to the second rising edge of the data strobe signal DQS0.

Reference sign 83A and reference sign 84A in FIG. 7 respectively denote latch timings of the latch circuits 83 and 84, respectively. The latch timings of the latch circuits 83 and 84 are edges <9> and <13> in the first burst input and edges <3> and <7> in the second burst input. As shown in FIG. 7, 3/2 clock cycles are ensured as a time period T1 from the change of the signal Wr45(180) to a time at which the latch circuit 83 performs a latch operation. Accordingly, even if the frequencies of the data strobe signals are high, an operation margin can be ensured sufficiently. In addition, the circuit scale of the burst counter 22 shown in FIG. 6 is smaller than that of the burst counter 22 shown in FIG. 3A, because the shift registers 40 and 60 are omitted.

Figure 8:
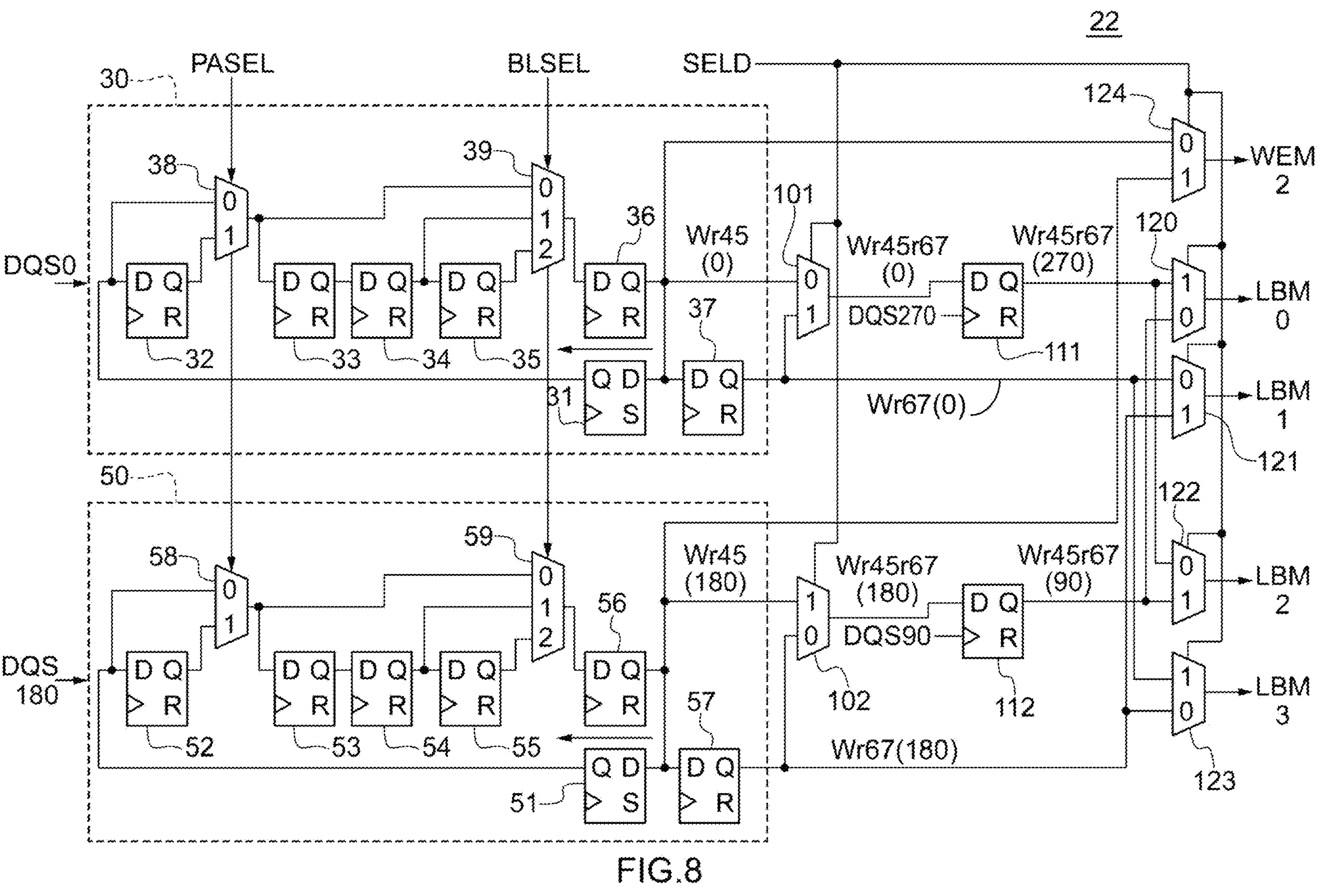
FIG. 8 is a circuit diagram of a burst counter according to a third embodiment.

FIG. 8 is a circuit diagram of the burst counter 22 according to a third embodiment. The burst counter 22 according to the third embodiment shown in FIG. 8 is different from the burst counter 22 according to the second embodiment shown in FIG. 6 in that the latch circuits 81 to 84 are replaced with multiplexers 101 and 102 and latch circuits 111 and 112. In the multiplexer 101, the signal Wr45(0) output from the latch circuit 36 is input to an input node "0", and the signal Wr67(0) output from the latch circuit 37 is input to an input node "1". A signal Wr45r67(0) output from the multiplexer 101 is supplied to a data input node D of the latch circuit 111. The latch circuit 111 performs a latch operation synchronously with the data strobe signal DQS270. In the multiplexer 102, the signal Wr45(180) output from the latch circuit 56 is input to an input node "1", and the signal Wr67(180) output from the latch circuit 57 is input to an input node "0". A signal Wr45r67(180) output from the multiplexer 102 is supplied to a data input node D of the latch circuit 112. The latch circuit 112 performs a latch operation synchronously with the data strobe signal DQS90.

The burst counter 22 shown in FIG. 8 includes multiplexers 120 to 124. The signal Wr45(0) output from the latch circuit 36 is supplied to an input node "0" of the multiplexer 124. The signal Wr67(0) output from the latch circuit 37 is supplied to an input node "0" of the multiplexer 121 and an input node "1" of the multiplexer 123. The signal Wr45(180) output from the latch circuit 56 is supplied to an input node "1" of the multiplexer 124. The signal Wr67(180) output from the latch circuit 57 is supplied to an input node "1" of the multiplexer 121 and an input node "0" of the multiplexer 123. A signal Wr45r67(270) output from the latch circuit 111 is supplied to an input node "1" of the multiplexer 120 and an input node "0" of the multiplexer 122. A signal Wr45r67 (90) output from the latch circuit 112 is supplied to an input node "1" of the multiplexer 122 and an input node "0" of the multiplexer 120. The outputs of the multiplexers 120 to 123 serve as the last bit signals LBM0 to LBM3, respectively. The output of the multiplexer 124 serves as the write end signal WEM2. The multiplexers 101, 102, and 120 to 124 are all controlled by the selection signal SELD.

Figure 9:
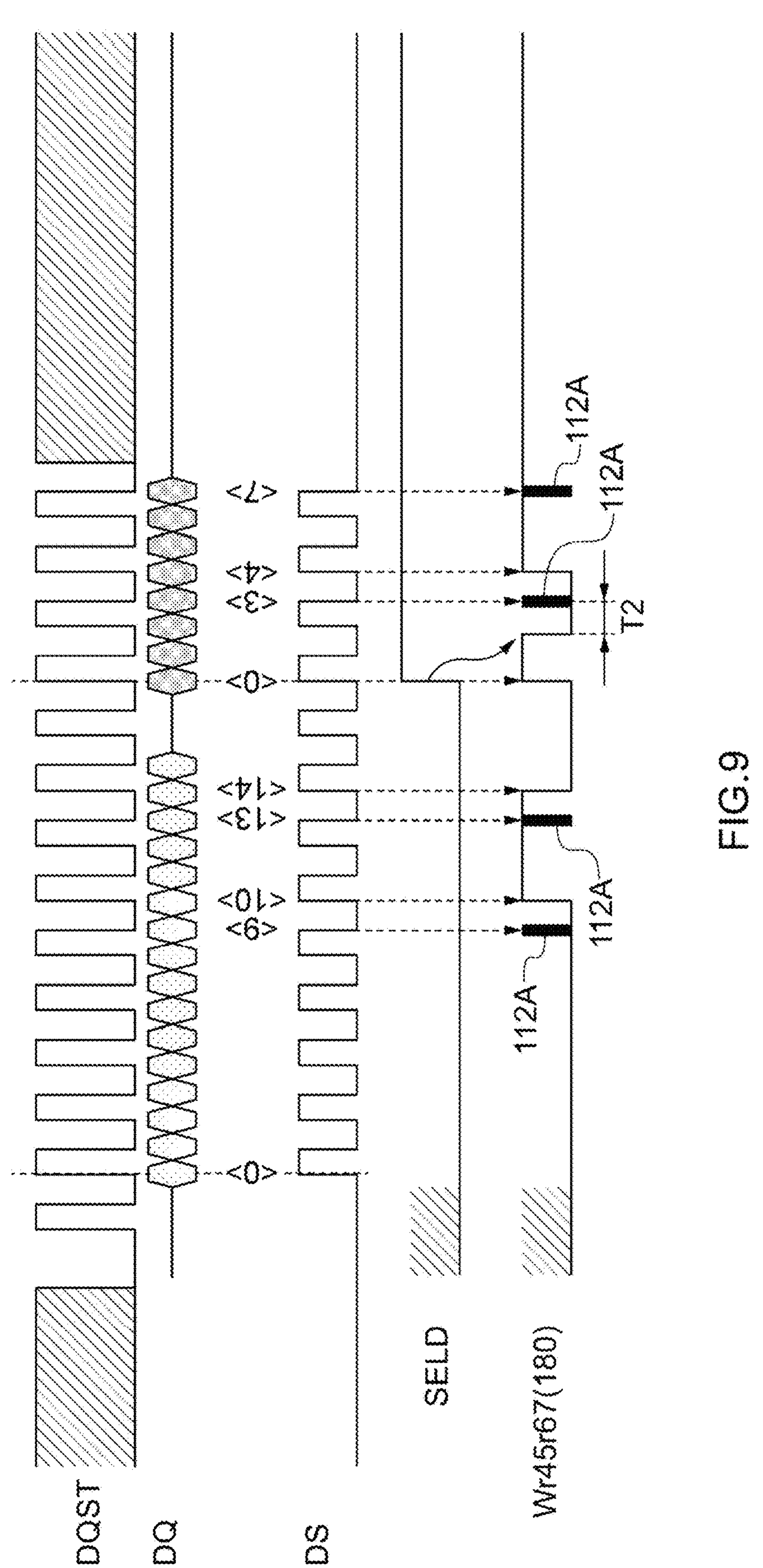
FIG. 9 is a timing chart for explaining an operation of the burst counter shown in FIG. 8.

FIG. 9 is a timing chart for explaining an operation of the burst counter 22 shown in FIG. 8. In the example shown in FIG. 9, an 8-bit burst input is performed immediately after a 16-bit burst input is performed, as in the example shown in FIG. 7. The toggle count of the data strobe signal DQST input between the first burst input and the second burst input is one. The first burst input corresponds to a case where a burst input starts synchronously with arising edge of the data strobe signal DQS0, and the second burst input corresponds to a case where a burst input starts synchronously with a rising edge of the data strobe signal DQS180.

In the first burst input, the signal Wr45r67(180) changes to level "1" at the edge <10> of the data strobe signal DS. The edge <10> corresponds to the third rising edge of the data strobe signal DQS180. Next, the signal Wr45r67(180) changes to level "0" at the edge <14> of the data strobe signal DS. The edge <14> corresponds to the fourth rising edge of the data strobe signal DQS180.

In the second burst input, the signal Wr45r67(180) changes to level "1" at the edge <0> of the data strobe signal DS. The edge <0> corresponds to the first rising edge of the data strobe signal DQS180. At this timing, the selection signal SELD is inverted synchronously with the edge <0>, and an input node selected by the multiplexer 102 is switched responsive to this inversion of the selection signal SELD. However, a predetermined delay is generated until the signal Wr45r67(180), which is the output of the multiplexer 102, changes to level "0". Next, the signal Wr45r67 (180) changes to level "1" at the edge <4> of the data strobe signal DS. The edge <4> corresponds to the second rising edge of the data strobe signal DQS180.

Reference sign 112A in FIG. 9 denotes a latch timing of the latch circuit 112. The latch timing of the latch circuit 112 is the edges <9> and <13> in the first burst input and the edges <3> and <7> in the second burst input. As shown in FIG. 9, a time period T2 from the change of the signal Wr45(180) to a time at which the latch circuit 112 performs a latch operation is a time period obtained by subtracting the operation delay of the multiplexer 102 from 3/2 clock cycles. The burst counter 22 shown in FIG. 8 has a further reduced circuit scale as compared to the burst counter 22 shown in FIG. 6, because the number of latch circuits is reduced.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which am within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:

a data terminal supplied with a set of write data including at least first, second, third and fourth write data supplied in numerical order from outside;

a dividing circuit configured to divide an original data strobe signal supplied synchronously with the set of write data to generate a first divided data strobe signal corresponding to the first write data, a second divided data strobe signal corresponding to the second write data, a third divided data strobe signal corresponding to the third write data, and a fourth divided data strobe signals corresponding to the fourth write data a first data latch circuit configured to latch the first write data synchronously with the first divided data strobe signal, the first data latch circuit being configured to be reset responsive to a first reset signal;

a second data latch circuit configured to latch the second write data synchronously with the second divided data strobe signal;

a third data latch circuit configured to latch the third write data synchronously with the third divided data strobe signal, the third data latch circuit being configured to be reset responsive to a third reset signal;

a fourth data latch circuit configured to latch the fourth write data synchronously with the fourth divided data strobe signal; and a burst counter circuit configured to, based on a selection signal, activate the first reset signal responsive to the first divided data strobe signal and activate the third reset signal responsive to the third divided data strobe signal, or activate the first reset signal responsive to the third divided data strobe signal and activate the third reset signal responsive to the first divided data strobe signal.

2. The apparatus of claim 1, wherein the burst counter circuit is configured to activate a write end signal responsive to the first divided data strobe signal or the third divided data strobe signal based on the selection signal, and wherein the original data strobe signal is blocked responsive to the write end signal so as not to be supplied to the dividing circuit.

3. The apparatus of claim 2, wherein the second data latch circuit is configured to be reset responsive to a second reset signal, and wherein the fourth data latch circuit is configured to be reset responsive to a fourth reset signal.

4. The apparatus of claim 3, wherein the burst counter circuit is configured to, based on the selection signal, activate the second reset signal responsive to the second divided data strobe signal, and activate the fourth reset signal responsive to the fourth divided data strobe signal, or activate the second reset signal responsive to the fourth divided data strobe signal and activate the fourth reset signal responsive to the second divided data strobe signal.

5. The apparatus of claim 4, wherein the burst counter circuit includes:

a first shift register including a plurality of latch circuits including a first latch circuit-, the first shift register being configured to perform a shift operation synchronously with the first data strobe signal;

a second shift register including a plurality of latch circuits including a second latch circuit, the second shift register being configured to perform a shift operation synchronously with the third divided data strobe signal; and a first selector configured to select, as the write end signal, an output signal of the first latch circuit or an output signal of the second latch circuit based on the selection signal.

6. The apparatus of claim 5, wherein the plurality of latch circuits of the first shift register further includes a third latch circuit configured to receive the output signal of the first latch circuit, and wherein the burst counter circuit further includes:

a second selector configured to select the output signal of the first latch circuit or an output signal of the third latch circuit based on the selection signal; and a fourth latch circuit configured to latch and output, as the second reset signal or the fourth reset signal, an output signal of the second selector synchronously with the fourth divided data strobe signal.

7. The apparatus of claim 5, wherein the plurality of latch circuits of the first shift register further includes a third latch circuit configured to receive the output signal of the first latch circuit, and wherein the burst counter circuit further includes:

a fourth latch circuit configured to latch an output signal of the third latch circuit synchronously with the fourth divided data strobe signal; and a fifth latch circuit configured to latch the output signal of the first latch circuit synchronously with the fourth divided data strobe signal.

8. The apparatus of claim 7, wherein the plurality of latch circuits of the second shift register further includes a sixth latch circuit configured to receive the output signal of the second latch circuit, and wherein the burst counter circuit further includes:

a seventh latch circuit configured to latch an output signal of the sixth latch circuit synchronously with the second divided data strobe signal; and an eighth latch circuit configured to latch the output signal of the second latch circuit synchronously with the second divided data strobe signal.

9. The apparatus of claim 8, wherein the burst counter circuit further includes a second selector configured to select and output, as the second reset signal or the fourth reset signal, an output signal of the fourth latch circuit or an output signal of the seventh latch circuit based on the selection signal.

10. The apparatus of claim 9, wherein the burst counter circuit further includes a third selector configured to select and output an output signal of the fifth latch circuit or an output signal of the eighth latch circuit as the second reset signal when the second selector selects and outputs the output signal of the fourth latch circuit or the output signal of the seventh latch circuit as the fourth reset signal, or the output signal of the fifth latch circuit or the output signal of the eighth latch circuit as the fourth reset signal when the second selector selects and outputs the output signal of the fourth latch circuit or the output signal of the seventh latch circuit as the second reset signal, based on the selection signal.

11. The apparatus of claim 5, wherein the burst counter circuit further includes:

a third shift register including a plurality of latch circuits including a third latch circuit, the third shift register being configured to perform a shift operation synchronously with the third divided data strobe signal; and a fourth shift register including a plurality of latch circuits including a fourth latch circuit, the fourth shift register being configured to perform a shift operation synchronously with the fourth divided data strobe signal.

12. The apparatus of claim 11, wherein the burst counter circuit further includes:

a second selector configured to select and output, as the second reset signal or the fourth reset signal, the output signals of the second latch circuit or an output signal of the fourth latch circuit based on the selection signal; and a third selector configured to select and output the output signal of the fourth latch circuit as the fourth reset signal when the second selector selects and outputs the output signal of the second latch circuit as the second reset signal, or the output signal of the second latch circuit as the fourth reset signal when the second selector selects and outputs the output signal of the fourth latch circuit as the second reset signal, or the output signal of the fourth latch circuit as the second reset signal when the second selector selects and outputs the output signal of the second latch circuit as the fourth reset signal, or the output signal of the second latch circuit as the second reset signal when the second selector selects and outputs the output signal of the fourth latch circuit as the fourth reset signal, based on the selection signal.

13. The apparatus of claim 12, wherein the plurality of latch circuits of the first shift register further includes a fifth latch circuit configured to receive the output signal of the first latch circuit, wherein the plurality of latch circuits of the second shift register further includes a sixth latch circuit configured to receive the output signal of the second latch circuit, and wherein the burst counter circuit further includes:

a fourth selector configured to select and output, as the first reset signal or the third reset signal, an output signal of the fifth latch circuit or an output signal of the sixth latch circuits based on the selection signal; and a fifth selector configured to select and output the output signal of the sixth latch circuit as the third reset signal when the fourth selector selects and outputs the output signal of the fifth latch circuit as the first reset signal, or the output signal of the fifth latch circuit as the third reset signal when the fourth selector selects and outputs the output signal of the sixth latch circuit as the first reset signal, or the output signal of the sixth latch circuit as the first reset signal when the fourth selector selects and outputs the output signal of the fifth latch circuit as the third reset signal, or the output of the fifth latch circuit as the first reset signal when the fourth selector selects and outputs the output signal of sixth latch circuit as the third reset signal, based on the selection signal.

14. The apparatus of claim 1, wherein the first, second, third, and fourth divided data strobe signals have first, second, third, and fourth phases, respectively, wherein the first and third phases are opposite to each other, and wherein the second and fourth phases are opposite to each other.

15. The apparatus of claim 14, wherein the fourth phase is different in 270° from the first phase.

16. An apparatus comprising:

a data terminal supplied with a set of write data in serial from outside;

a gating circuit configured to pass an original data strobe signal supplied synchronously with the set of write data until a write end signal indicating an end time of receiving the set of write data is activated;

a dividing circuit configured to divide the original data strobe signal passed through the gating circuit to generate a plurality of divided data strobe signals including first and second divided data strobe signals having opposite phase from each other; and a burst counter circuit including:

a first shift register configured to perform a shift operation synchronously with the first divided data strobe signal;

a second shift register configured to perform a shift operation synchronously with the second divided data strobe signal; and a first selector configured to select and output, as the write end signal, one of a first output signal of the first shift register and a second output signal of the second shift register based on a selection signal.

17. The apparatus of claim 16, further comprising:

a first data latch circuit configured to latch a first one of the set of write data synchronously with the first divided data strobe signal; and a second data latch circuit configured to latch a second one of the set of write data synchronously with the second divided data strobe signal.

18. The apparatus of claim 17, wherein the first data latch circuit is configured to be reset responsive to a first reset signal, and wherein the second data latch circuit is configured to be reset responsive to a second reset signal.

19. The apparatus of claim 18, wherein the plurality of divided data strobe signals further includes third and fourth divided data strobe signals having opposite phase from each other, wherein the burst counter circuit further includes a third shift register configured to perform a shift operation synchronously with the third divided data strobe signal, and a fourth shift register configured to perform a shift operation synchronously with the fourth divided data strobe signal, and wherein the burst counter circuit further includes a second selector configured to select and output, as one of the first and second reset signals, one of a third output signal of the third shift register and a fourth output signal of the fourth shift register based on the selection signal.

20. An apparatus comprising:

a data terminal supplied with a set of write data in serial from outside;

a gating circuit configured to pass an original data strobe signal supplied synchronously with the set of write data until a write end signal indicating an end time of receiving the set of write data is activated;

a dividing circuit configured to divide the original data strobe signal passed through the gating circuit to generate a first divided data strobe signal, a second divided data strobe signal, a third divided data strobe signal, and a fourth divided data strobe signal each having a mutually different phase from one another;

a first data latch circuit configured to latch a first one of the set of write data synchronously with the first divided data strobe signal;

a second data latch circuit configured to latch a second one of the set of write data synchronously with the second divided data strobe signal;

a third data latch circuit configured to latch a third one of the set of write data synchronously with the third divided data strobe signal;

a fourth data latch circuit configured to latch a fourth one of the set of write data synchronously with the fourth divided data strobe signal; and a burst counter circuit configured to generate the write end signal, a first reset signal, and a second reset signal, wherein the second data latch circuit is configured to be reset responsive to the first reset signal, wherein the fourth data latch circuit is configured to be reset responsive to the second reset signal, and wherein the burst counter circuit is configured to:

activate the write end signal responsive to the first divided data strobe signal or the third divided data strobe signal;

activate the first reset signal responsive to the second divided data strobe signal and activate the second reset signal responsive to the fourth divided data strobe signal, or activate the first reset signal responsive to the fourth divided data strobe signal and activate the second reset signal responsive to the second divided data strobe signal.

* * * * *